United States Patent
Anc

(10) Patent No.: US 9,466,771 B2
(45) Date of Patent: Oct. 11, 2016

(54) WAVELENGTH CONVERTERS AND METHODS FOR MAKING THE SAME

(71) Applicant: Maria J. Anc, Groveland, MA (US)

(72) Inventor: Maria J. Anc, Groveland, MA (US)

(73) Assignee: OSRAM SYLVANIA Inc., Wilmington, MA (US)

( * ) Notice: Subject to any disclaimer, the term of this patent is extended or adjusted under 35 U.S.C. 154(b) by 2 days.

(21) Appl. No.: 14/339,020

(22) Filed: Jul. 23, 2014

(65) Prior Publication Data

US 2016/0027971 A1    Jan. 28, 2016

(51) Int. Cl.
*H01L 21/00* (2006.01)
*H01L 33/50* (2010.01)
*C09K 11/02* (2006.01)
*C09K 11/08* (2006.01)
*H01L 33/52* (2010.01)

(52) U.S. Cl.
CPC .......... *H01L 33/508* (2013.01); *C09K 11/025* (2013.01); *C09K 11/08* (2013.01); *H01L 33/504* (2013.01); *H01L 33/507* (2013.01); *H01L 33/52* (2013.01); *H01L 2933/005* (2013.01); *H01L 2933/0041* (2013.01)

(58) Field of Classification Search
CPC .... H01L 33/504; H01L 33/52; H01L 33/507
See application file for complete search history.

(56) References Cited

U.S. PATENT DOCUMENTS

| | | |
|---|---|---|
| 8,017,972 B2 | 9/2011 | Lee et al. |
| 8,674,390 B2 | 3/2014 | Harris et al. |
| 2007/0228932 A1 | 10/2007 | Amano et al. |
| 2013/0075692 A1 | 3/2013 | Naasani et al. |
| 2013/0189803 A1 | 7/2013 | Nasaani et al. |
| 2013/0190493 A1 | 7/2013 | Naasani |
| 2013/0194794 A1 | 8/2013 | Kim |
| 2014/0022779 A1 | 1/2014 | Su et al. |

*Primary Examiner* — Richard Booth
(74) *Attorney, Agent, or Firm* — Robert F. Clark; Shaun P. Montana

(57) ABSTRACT

Disclosed herein are wavelength converters and methods for making the same. The wavelength converters include a single layer of a polymeric matrix material, and one or more types of wavelength converting particles. In some embodiments the wavelength converters include first and second types of wavelength converting particles that are distributed in a desired manner within the single layer of polymeric matrix material. Methods of forming such wavelength converters and lighting devices including such wavelength converters are also disclosed.

14 Claims, 5 Drawing Sheets

WAVELENGTH CONVERTERS AND METHODS FOR MAKING THE SAME

FIELD

The present disclosure generally relates to wavelength converters, methods for making the same and lighting devices including such wavelength converters. More particularly, the present disclosure generally relates to wavelength converters that include one or more types of quantum dot beads either alone or in combination with phosphor particles, as well as methods for making such wavelength converters.

BACKGROUND

Light emitting diode (LED) chips can generate visible or non-visible light in a specific region of the electromagnetic spectrum depending on the material composition of the LED. When it is desired to construct an LED light source that produces light of a color different from the output color of the LED, it is known to use a wavelength converter to convert all or a portion of the light output from the LED chip having a first wavelength or wavelength range (the "primary light" or "excitation light") to light having a second wavelength or wavelength range (the "secondary light" or "emission light").

Many wavelength converters include a wavelength converting composition that itself includes a polymeric matrix encapsulating a wavelength conversion material. The wavelength conversion material generally functions to convert primary light to secondary light via photoluminescence. In some instances the wavelength conversion material absorbs relatively high energy primary light, which can excite the wavelength conversion material to a higher energy state. When the wavelength conversion material returns to a lower energy state it emits secondary light, generally of a longer wavelength/wavelength range than the primary light. The wavelength/wavelength range of the secondary light can depend on the type of wavelength conversion material used. Secondary light of a desired wavelength/wavelength range may therefore be attained by proper selection of wavelength conversion material. This process may be understood as "wavelength down conversion." An LED that is combined with a wavelength converter to produce secondary light may be described as a "wavelength converted LED."

As noted previously a wavelength converting composition may include a matrix, which may include or be formed from a polymer such as silicone or an epoxy. The matrix (also referred to herein as an encapsulant) encapsulates a wavelength conversion material, such as phosphor particles. Configurations wherein a wavelength converter is disposed adjacent a surface of an LED chip are referred to herein as a "chip level conversion" or "CLC" configuration. In other configurations a wavelength converter may be placed remotely from the emitting surface of the LED. Such a configuration is referred to herein as a "remote conversion" configuration.

Quantum dots (QDs), also referred to as semiconductor nanocrystals, are relatively new materials that have potential use in the lighting industry. Like conventional phosphor particles, some quantum dots have the ability to absorb incident light (e.g., primary light) and reradiate light (e.g., secondary light) in another portion of the electromagnetic spectrum. QDs exhibit unique characteristics, which can be employed for creating wavelength converters with precisely designed output spectra. These unique properties include broad absorption spectrum (freedom of the choice of the excitation wavelength) and narrow-band emission (30-50 nm) with the peak wavelength determined by the material and size of the QD. Tunability of the peak emission wavelength of the QDs within few nanometers by changing their size offers a unique capability of creating finely tuned emission colors. As a result, quantum dots have been investigated for potential use in the formation of wavelength converters for semiconductor devices such as LEDs.

BRIEF DESCRIPTION OF THE DRAWINGS

Reference is now made to the following detailed description which should be read in conjunction with the following figures, wherein like numerals represent like parts.

DETAILED DESCRIPTION

Figure 1:
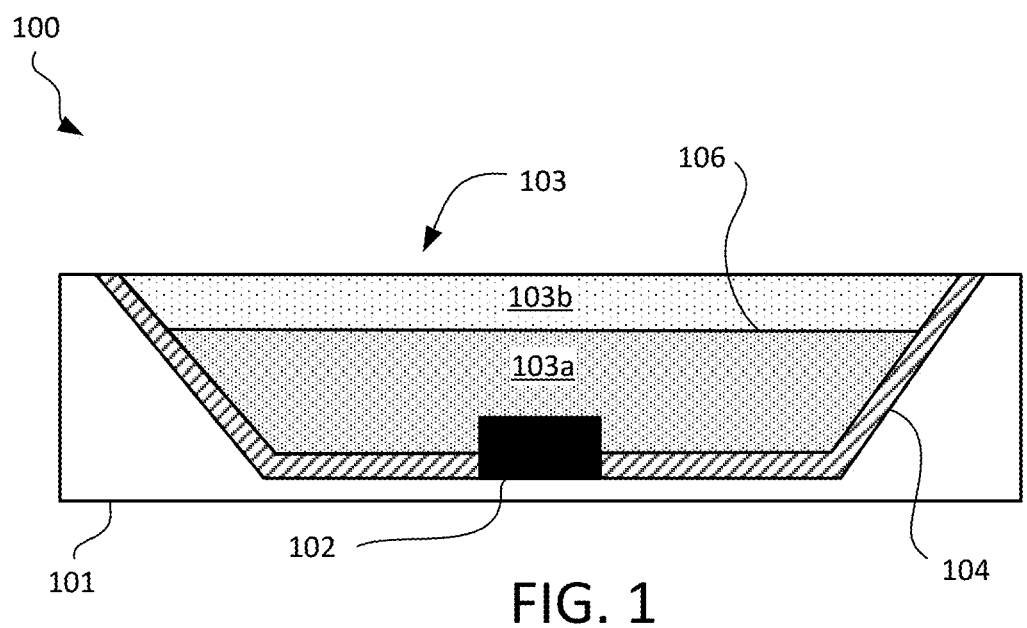
FIG. 1 illustrates one example of a wavelength converted light emitting diode package having a chip level conversion structure.

The present disclosure will now proceed with reference to the accompanying drawings, in which example embodiments consistent with the present disclosure are shown. It should be understood that the examples in the figures are for the sake of illustration and ease of understanding only and that the methods, wavelength converters, and devices described herein may be embodied in many forms and are not limited to the illustrated embodiments in the figures. or specific embodiments described herein.

One or more elements of the present disclosure may be numerically designated, e.g., as a first, second, third, etc. element. In this context it should be understood that the numerical designation is for the sake of clarity only (e.g., to distinguish one element from another), and that elements so designated are not limited by their specific numerical designation. Moreover the specification may from time to time refer to a first element may be described as being "on" a second element. In that context it should be understood that the first element may be directly on the second element (i.e., without intervening elements there between), or that one or more intervening elements may be present between the first and second elements. In contrast, the term "directly on" means that the first element is present on the second element without any intervening elements there between.

As used herein singular expressions such as "a," "an," and "the" are not limited to their singular form, and are intended to cover the plural forms as well unless the context clearly indicates otherwise. Specific terms/phrases excepted from this understanding include "single layer," and "single layer wavelength converter," which are used herein to designate a single (i.e., one) layer and a wavelength converter that is made up of a single (i.e. one) layer. As will be described in detail below non-limiting examples of single layer wavelength conversion materials consistent with the present disclosure include a single layer of matrix material including wavelength converting particles, such as but not limited to a combination of phosphor particles and quantum dot particles. This is in contrast to multilayer wavelength converters, in which several layers of different wavelength converting compositions are stacked on or otherwise aligned with one another.

As used herein, the terms "substantially" and "about" when used in connection with an amount or range mean plus or minus 5% of the stated amount or the endpoints of the stated range.

As used herein, the term "optically transparent" when used in connection with a material (e.g., a matrix material, filler, etc.) means that the referenced material transmits greater than or equal to about 80% of incident light, such as greater than or equal to about 90%, greater than or equal to about 95%, or even greater than or equal to about 99% of incident light. The incident light may be of a specified wavelength or wavelength range (e.g., ultraviolet, visible, infrared, etc.), or may span multiple wavelength ranges. Without limitation, materials described herein as being optically transparent preferably transmit greater than or equal to about 95% (e.g., greater than or equal to about 99%) of incident light in at least one of the ultraviolet, visible, and infrared regions of the electromagnetic spectrum.

As used herein, the terms, "light emitting diode," "LED," and "LED light source" are used interchangeably, and refer to any light emitting diode or other type of carrier injection/junction-based system that is capable of generating radiation in response to an electrical signal. Thus, the term LED includes, but is not limited to, various semiconductor-based structures that emit light in response to current, light emitting polymers, electro-luminescent strips, combination thereof and the like.

In particular, the term LED refers to light emitting diodes of all types (including semi-conductor and organic light emitting diodes) that may be configured to generate light in all or various portions of one or more of the visible, ultraviolet, and infrared spectrum. Non-limiting examples of suitable LEDs that may be used include various types of infrared LEDs, ultraviolet LEDs, red LEDs, green LEDs, blue LEDs, yellow LEDs, amber LEDs, orange LEDs, and white LEDs. Such LEDs may be configured to emit light over a broad spectrum (e.g., the entire visible light spectrum) or a narrow spectrum. (References to the color of a phosphor, LED or conversion material refer generally to its emission color unless otherwise specified. Thus, a blue LED emits a blue light, a yellow phosphor emits a yellow light and so on.)

From time to time one or more aspects of the present disclosure may be described using ranges. In such instances it should be understood that the indicated ranges are exemplary only unless expressly indicated otherwise. Moreover, the indicated ranges should be understood to include all of the individual values of falling within the indicated range, as though such values were expressly recited. Moreover, the ranges should be understood to encompass sub ranges within the indicated range, as though such sub ranges were expressly recited. By way of example, a range of 1 to 10 should be understood to include 2, 3, 4 . . . etc., as well as the range of 2 to 10, 3 to 10, 2 to 8, etc., as though such values and ranges were expressly recited.

In the present disclosure the term "cured" is often used in connection with the term "matrix material," particularly when the matrix material includes a polymeric component. In this context the term "cured" should be understood to mean that the polymeric component of the matrix material exhibits a degree of polymerization and/or crosslinking that is/are greater than or equal to about 90%, greater than or equal to about 95%, greater than or equal to about 99%, or even about 100%. Thus the term "cured matrix material" should be understood to encompass matrix materials formed by or including a polymeric component that exhibits a degree of polymerization greater than or equal to about 90, 95, 99, or even 100%, a degree of crosslinking of about 90, 95, 99, or even 100%, and combinations thereof. The term "cure time" refers to the amount of time required to convert a matrix precursor to a cured polymeric matrix.

As briefly described in the background quantum dots (i.e., semiconductor nanocrystals) have been investigated for use in lighting applications, e.g., as a material for converting primary light from a light source (e.g., a light emitting diode) to secondary light. Although research has shown that quantum dots have some promise for use in such applications, improvements in the manufacture of wavelength converters including quantum dots and light sources including such converters remain of interest.

To illustrate some of the considerations that may be taken into account when using quantum dots in wavelength converting applications reference is made to FIG. 1, which depicts an embodiment wherein a layer including quantum dots is used to color correct the light output of a phosphor converted light emitting diode. Specifically, FIG. 1 depicts an LED package 100 that includes a frame 101, LED chip 102, reflector 104 and a multilayer wavelength converter 103 including first wavelength conversion layer 103a and second wavelength conversion layer 103b. In this embodiment first wavelength conversion layer 103a includes phosphor particles that convert at least a portion of primary light emitted by LED chip 102 to secondary light. Second wavelength conversion layer 103b includes quantum dots that are configured to convert at least a portion of the primary and/or secondary light to tertiary light, so as to adjust the color temperature of the collective light output from LED package 100.

In the embodiment of FIG. 1 LED chip 102 may be configured to emit primary light in the ultraviolet region of the spectrum. First wavelength conversion layer 103a may include blue and green broad-band emitting phosphor particles in a polymeric binder, and may convert at least a portion of the primary (UV) light to secondary (e.g., blue and green) light. Secondary light and unconverted primary light may then impinge on second wavelength conversion layer 103b, which may include red quantum dot particles that convert at least a portion of the unconverted primary and/or secondary light to tertiary (e.g., red) light. The addition of red light by the second wavelength conversion layer may "warm up" the collective light output of LED package 100, e.g., such that the collective light output may exhibit a relatively warm correlated color temperature (CCT), e.g., of around 2700-3500 Kelvin (K).

As shown by this embodiment the quantum dots in second wavelength conversion layer 103b may be used to adjust the color temperature of the combined light output of LED chip 102 and first wavelength conversion layer 103a. Although effective, the use of two separate wavelength conversion layers increases the complexity and cost of manufacturing LED package 100, e.g., by requiring the formation of two distinct layers containing two different wavelength converting compositions.

Moreover the use of two or more wavelength conversion layers means that at least one interface will be present between the layers. This concept is illustrated in FIG. 1 by interface 106, which is present between first and second wavelength conversion layers 103a and 103b. Although wavelength conversion layers 103a and 103b may be index matched to a significant degree, the presence of interface 106 may adversely affect the performance of LED package 100, e.g., by introducing scattering, reflection and/or other unwanted optical effects. Interface 106 and wavelength conversion layers 103a, 103b may also be subject to repeated heating and cooling stresses when LED chip 102 is cycled ON and OFF, particularly when LED chip 102 is operated at relatively high power and produces significant amounts of heat. In such instances delamination of wavelength conversion layers 103a, 103b may occur over time, potentially limiting the useful life of LED package 100.

With the foregoing in mind one aspect of the present disclosure relates to single layer wavelength converters. The wavelength converters include a wavelength converting composition. The wavelength converting composition includes a polymeric matrix material and multiple types of wavelength converting particles. As will become apparent from the following disclosure, the polymeric matrix may serve as a "host" or "binder" material for the wavelength converting particles. Moreover the distribution of at least one of the wavelength converting particles within the polymeric matrix material may vary considerably, and may be set or determined by the manner in which the wavelength converting composition is provided and/or by the process conditions used to cure a precursor of the polymeric matrix material (hereinafter referred to as a "matrix precursor").

Non-limiting examples of suitable polymeric matrix materials that may be used in the single layer wavelength converters of the present disclosure include various types of optically transparent polymers, including acrylate polymers such as polymethyl methacrylate, cellulose polymers such as methyl cellulose, ethyl cellulose, etc., epoxide polymers, polyamides, polycarbonates, polyesters such as polyethylene terephthalate, polyimides, polyisobutylenes, polyvinylidene fluoride, silicone polymers, poly(silphenylene-siloxane) gels (also known as "silphenylenes" or "silarene-siloxanes."), polystyrenes, and polyvinylalcohol polymers (PVA). Without limitation, the polymeric matrix material in the wavelength converting compositions described herein is preferably selected from a silicone or an epoxide.

The polymeric matrix materials of the present disclosure are preferably formed by curing (e.g. polymerizing, crosslinking, etc.) a matrix precursor. The matrix precursor may be any precursor formulation in which the wavelength converting particles described herein can be dispersed and which can be converted to the polymeric matrix material. For example, a matrix precursor may be a formulation of corresponding monomer(s) and optional additional components (e.g., photoinitiators, catalysts, crosslinking agents, which may be converted to the polymeric matrix material by any method known in the art.

In some embodiments the matrix precursors of the present disclosure are selected from thermal and/or photopolymerizable formulations that exhibit a cure time that varies with applied temperature, light intensity, or a combination thereof. Put in other terms, the cure rate (gel time) of the matrix precursors described herein may be impacted by one or more process parameters applied when such precursors are cured, such as the temperature applied during curing of a thermally curable matrix precursor (curing temperature), the intensity of light (curing light intensity) applied during curing of a photopolymerizable matrix precursor, or some combination thereof.

For example when the polymer matrix material is a silicone or an epoxy, the matrix precursors may be selected from silicone or epoxy precursors, respectively, wherein such precursors exhibit a cure time that decreases as curing temperature and/or curing light intensity increases, and vice versa. The impact of curing temperature and/or curing light intensity may be evaluated for example by measuring the viscosity of the matrix precursor (and ultimately the resulting polymer) while curing various samples of the matrix precursor under various curing temperatures and/or curing light intensities, and then comparing the measured viscosity vs. time for each sample. Alternatively, curing of the polymer matrix may be evaluated using Fourier transform infrared spectroscopy (FTIR).

As will be described later the wavelength converters of the present disclosure may be formed by adding wavelength converting particles to a previously deposited matrix precursor, and curing the matrix precursor. Alternatively the wavelength converters described herein may be formed by depositing a mixture, emulsion, dispersion and/or suspension of one or more types of wavelength converting particles in a matrix precursor on a substrate, followed by curing of the matrix precursor. In either case curing of the matrix precursor maybe performed so as control or set the distribution of one or more of the types of wavelength converting particles within the resulting cured polymeric matrix material.

For example one or more process parameters applied while the matrix precursor is cured may be set based at least in part on a predicted settling rate for each of the wavelength converting particles in the wavelength converting composition. By controlling and/or selecting the viscosity of the polymer precursor and curing parameters such as temperature, light intensity, combinations thereof and the like, the cure time of the matrix precursor may be increased or decreased, thereby providing greater or less time for the wavelength converting particles therein to settle, float, or some combination thereof. As will be explained in greater detail later this opens avenues towards a mechanism for controlling the distribution of one or more types of wavelength converting particles within a single layer wavelength converter.

With the foregoing in mind the viscosity of the matrix precursor may impact the settling rate of wavelength converting particles dispersed therein. For example as the viscosity of the matrix precursor increases the settling rate of wavelength converting particles within the matrix precursor may decrease, whereas settling rate of the wavelength converting particles may increase with decreasing matrix precursor viscosity. It may therefore be advantageous to select matrix precursors with a desired viscosity, or to adjust the viscosity of a matrix precursor to within a desired range, e.g., through dilution, solvent evaporation, or another suitable mechanism. Accordingly in some embodiments matrix precursors consistent with the present disclosure may have a viscosity ranging from about 50 centipoise (cP) to about 30,000 cP, such as about 100 to about 20,000 cP, or even about 100 to about 10,000 cP.

The density of the polymeric matrix material and the matrix precursor can also have an impact on the settling of wavelength converting particles therein. It may therefore be of interest to select a polymeric matrix material and/or corresponding matrix precursor based on one or both of their densities, and in some cases on the relationship of either or both of their densities to the density of the wavelength converting particles used in the wavelength converters described herein. In this regard, the density of the polymeric matrix material and/or its precursor may range from about 0.5 to about 2.0 g/cm$^3$, such as about 0.9 to about 1.6 g/cm$^3$. In some embodiments, the polymeric matrix material is a polyethylene having a density of about 0.9 g/cm$^3$ or an epoxy having a density of about 1.6 g/cm$^3$.

In some embodiments the density of the matrix precursor may be more than, less than or equal to one or a combination of types of wavelength converting particles dispersed therein. For example in some embodiments first and second types of wavelength converting particles may be dispersed in a matrix precursor. In such instances, the density of the matrix precursor may be less than the density of one or both of the first and second types of wavelength converting particles, more than the density of one or both of the first and second types of wavelength converting particles, or equal to the density of one or both of the first and second types of wavelength converting particles. In some embodiments, the density of the matrix precursor is preferably greater than the first type of wavelength converting particles (e.g., quantum dot beads), and less than the density of the second type of wavelength converting particles (e.g., phosphor particles).

As may be appreciated when wavelength converting particles such as quantum dot beads are dispersed in a matrix precursor, those having a density less than the density of the matrix precursor may tend to float towards an upper surface of the matrix precursor over time, whereas those with a density greater than the density of the matrix precursor may tend to sink to a lower surface of the matrix precursor over time. Similarly, wavelength converting particles with a density equal to that of the matrix precursor may remain suspended within the matrix precursor, even over relatively extended periods of time. Therefore in embodiments wherein the density of a matrix precursor is greater than that of a first type of wavelength converting particles (e.g., quantum dot beads) dispersed therein but is less than that of a second type of wavelength converting particles (e.g. phosphor particles) dispersed therein, the first type of wavelength converting particles may tend to float towards an upper surface of the matrix precursor over time, whereas the second type of wavelength converting particles may tend to sink to a lower surface of the matrix precursor over time.

The polymeric matrix materials of the present disclosure may also exhibit desirable optical properties such as but not limited to optical transparency with regard to incident light of a given wavelength or wavelength range. For example in some embodiments the polymeric matrix materials transmit greater than or equal to about 80, 85, 90, 95, or even about 99% of incident light in at least one of the ultraviolet, visible, and/or infrared regions of the electromagnetic spectrum. When used in connection with a light emitting diode and wavelength converting particles consistent with the present disclosure, the polymeric matrix material preferably transmits greater than or equal to 80, 85, 90, 95, or even about 99% of incident primary light emitted by the light emitting diode, and the same or similar percentage of incident secondary, tertiary, quaternary, etc. light emitted by the wavelength converting particles.

As noted above the wavelength converting compositions of the present disclosure may include one or more types of wavelength converting particles that are distributed within a polymeric matrix material. Generally, the particles may be incorporated into the wavelength converter by adding them to a matrix precursor, followed by curing the matrix precursor to form the polymeric matrix material with the wavelength converting particles distributed therein.

Although the present disclosure envisions embodiments wherein many different types of wavelength converting particles are included in a polymeric matrix material (e.g. one or more types of phosphor particles, one or more types of quantum dot particles, etc.), for the sake of clarity and ease of understanding the present disclosure will focus on embodiments wherein a wavelength converter includes two types of wavelength converting particles. Therefore in some embodiments the wavelength converting compositions may include at least first and second types of wavelength converting particles, wherein the first and second types of wavelength converting particles differ in at least one of composition, density, and particle size. As described below these and other factors may impact the settling rate of the wavelength converting particles within a matrix precursor, and thus may impact the distribution of such particles within a cured polymeric matrix material.

Using fluid dynamics it is possible to estimate the rate at which wavelength converting particles will settle in a matrix precursor under the influence of gravity (i.e., settling rate or, more specifically, gravitational settling rate). Specifically, assuming spherical wavelength converting particles, the motion of a wavelength converting particle of mass m in a matrix precursor (fluid) under the action of an external force $F_e$ (in this case gravity) may be described using equation (I) below:

$$mdu/dt = F_e - F_b - F_d \qquad (I)$$

where m is mass of the particle, du/dt is the change in velocity (u) of the wavelength converting particle over change in time (t); $F_e$ is the gravitational force (product of mass and acceleration of the wavelength converting particle due to gravity); $F_b$ is the buoyant force (product of the mass of the matrix precursor displaced by the wavelength converting particle and the acceleration due to gravity); and $F_d$ is the drag force (due to relative motion between the wavelength converting particle and the matrix precursor).

As the particle velocity increases $F_d$ and $F_b$ will balance the gravitational force ($F_e$), resulting in no further changes to particle velocity. In the case of spherical particles and gravitational settling, this terminal velocity or settling rate (S) may be estimated taking into account the balance of the above noted forces and applying the Reynolds number of the particles and using the Stokes law equation for the condition of laminar flow. Specifically, the settling rate of the (assumed spherical) particles may be estimated using equation (II)—below:

$$S = g(\rho_p - \rho_f)D_p^2/18\mu \qquad (II)$$

where S is the settling rate of the wavelength converting particle in the matrix precursor; g is acceleration of the wavelength converting particle due to gravity; $\rho_p$ is the density of the particle; $\rho_f$ is the density of the matrix precursor (fluid); $D_p$ is the diameter of the wavelength converting particle; and μ is the dynamic viscosity of the matrix precursor.

As may be appreciated from equation (II), the estimated settling rate of the wavelength converting particles may increase (assuming other variables remain constant) with increasing particle density (i.e., as the value of ($\rho_p - \rho_f$) increases), as particle size ($D_r$) increases, and/or as the dynamic viscosity (μ) of the matrix precursor decreases. Conversely the estimated settling rate may decrease with decreasing particle density, as the value of ($\rho_p - \rho_f$) decreases, and/or as the dynamic viscosity of the matrix precursor increases. As will be described later the estimated settling rate of the wavelength converting particles may be used to guide curing of a matrix precursor, so as to obtain single layer wavelength converters with a desired distribution of wavelength converting particles therein.

With the foregoing in mind in some embodiments the wavelength converting compositions described herein include at least first and second types of wavelength converting particles, wherein the first and second types of wavelength converting particles have first and second (estimated) settling rates in a matrix precursor and/or a polymeric matrix material, respectively, and the first and second settling rates are different. As demonstrated by equation (II) above, this may be accomplished for example by the selection of first and/or second wavelength converting particles that have different densities and/or a desired density relationship, by increasing or decreasing the particle size of the first and/or second types of wavelength converting particles (e.g., relative to one another or independently), or a combination thereof.

In some instances the settling rate of the first type of wavelength converting particles may be more than the settling rate of a second type wavelength converting particles. For example the settling rate of the first type of wavelength converting particles (e.g., phosphor particles) may be 2, 3, 5, 10, 15, 20, 30 or more times greater than the settling rate of the second type of wavelength converting particles (e.g., quantum dot particles).

In some embodiments the wavelength converting compositions of the present disclosure may include at least first and second types of wavelength converting particles, wherein the first and second wavelength converting particles have first and second densities, respectively, wherein the first and second densities are different. Likewise in other non-limiting embodiments the wavelength converting compositions of the present disclosure may include at least first and second types of wavelength converting particles, wherein the first and second types of wavelength converting particles have first and second particle sizes or particle size distributions, wherein the first and second particle sizes and/or distributions are different.

Phosphor particles are one example type of wavelength converting particles that may be used in the wavelength converting compositions described herein. As may be generally understood by one skilled in the art, a phosphor is a compound capable of emitting, upon excitation by an external energy source (e.g., primary light), useful quantities of radiation (e.g., secondary light") particularly in the visible and/or ultraviolet region of the electromagnetic spectrum. Examples of suitable phosphors particles that may be used in the wavelength conversion compositions described herein include but are not limited to powdered and/or particulate forms of yellow phosphor, green phosphor, red phosphor, and/or combinations thereof. Of course, these example phosphor types are not limiting, and any suitable phosphor particles may be used in accordance with the present disclosure.

Other non-limiting examples of phosphor particles that may be used in accordance with the present disclosure include powdered and/or particulate forms of one or more inorganic phosphors such as powdered and/or particulate oxyfluoride, nitride (including oxynitride), and oxide phosphors (e.g., aluminate garnets, silicates etc.). Other non-limiting examples of suitable phosphor particles include particulate forms of phosphors containing one or more of cerium-activated yttrium aluminum garnet (YAG:Ce), cerium-activated yttrium gadolinium aluminum garnet (YGdAG:Ce), cerium-activated lutetium aluminum garnet (LuAG:Ce), europium- or cerium-activated alkaline earth (AE) silicon oxynitride (AE-SiON:Eu, where AE designates at least one element selected from Ba, Sr, and Ca), europium- or cerium-activated metal-SiAlON (M-SiAlON, where M is chosen from alkali ions, rare earth ions, alkaline earth ions, Y, Sc, and combinations thereof), and the like.

In some embodiments the phosphor particles may be doped with a small amount of an activator ion such as but not limited to cerium, gadolinium, scandium, europium, combinations thereof, and the like. When used, the amount of activator ion may vary widely, e.g., from greater than 0 to about 10 atomic %, such as about 1 to about 5 atomic %, or even about 1 to 2 atomic percent. In one non-limiting embodiment, the wavelength converting particles described herein include phosphor particles that include a combination of two or more of doped YAG, doped LuAG, doped silicates, and doped nitride phosphors. As noted above, the density of the phosphor particles may impact the rate at which they settle in a matrix precursor, and thus their distribution within a cured polymeric matrix material. It may therefore be desirable to select phosphor particles for use in the wavelength converting compositions described herein based at least in part on their density, either independently or in relation to the density of other wavelength converting particles that may be used. Therefore in some embodiments the density of the phosphor particles noted above may range from about 4 to about 6.5 g/cm$^3$ such as about 4.5 to about 6.0 g/cm$^3$. In further non-limiting embodiments the phosphor particles may be more or less dense than other wavelength converting particles within the polymeric matrix and matrix precursor, such as but not limited to quantum dot particles (described below). For example, the phosphor particles may have a density that is 2, 3, 4, 5 or more times greater than that of the density of at least one other type of wavelength converting particles included in the wavelength converting composition (e.g., quantum dot particles).

As also noted above the particle size and/or particle size distribution of the phosphor particles may impact the rate at which they settle in a matrix precursor, and therefore may potentially affect their distribution within a cured polymeric matrix material. It may therefore be desirable to select phosphor particles for use in the wavelength converting compositions described herein based at least in part on their particle size/distribution, either independently or in relation to the particle size/distribution of other wavelength converting particles dispersed in the polymer matrix material and/or matrix precursor (e.g., quantum dot particles). Therefore in some embodiments the phosphor particles described herein may have a particle size ranging from about 1 to about 100 microns, such as about 10 to about 50 microns, or even about 20 to about 40 microns. In some embodiments, the particle size of the phosphor particles ranges from about 20 to about 40 microns. In these or other non-limiting embodiments the particle size of the phosphor particles may be larger or smaller than another type of wavelength converting particles within the polymeric matrix and matrix precursor, such as but not limited to quantum dot particles that may be included in the wavelength converting composition.

As used herein, quantum dot particles (i.e., semiconductor nanocrystals)) are another example type of wavelength converting particles that may be used to convert light from one wavelength or wavelength range to another wavelength or wavelength range in in accordance with the present disclosure. In general, the quantum dot particles described herein may include quantum dots, which may be understood as semiconductor nanocrystals that are smaller than the Bohr radius of their corresponding bulk semiconductor. It should be understood that the present disclosure is not limited to any particular type of quantum dot particles, so long as such particles are capable of converting light from a first wavelength or wavelength range to a second wavelength of wavelength range.

For the sake of clarity and ease of understanding, the term "core quantum dot particles" is used herein to refer to semiconductor nanocrystals that may or may not be overcoated with one or more organic ligands to prevent agglomeration, facilitate dispersion, and/or to passivate non-radiative recombination centers on the surface. In contrast, the term "core/shell quantum dot particles" is used to refer to semiconductor nanocrystal particles in which a first semiconductor nanocrystal forms a "core" that is overcoated with a "shell" of a larger bandgap semiconductor nanocrystalline material. Like core quantum dot particles, core/shell quantum dot particles may or may not be further overcoated with one or more organic ligands to prevent agglomeration, facilitate dispersion, and/or to passivate non-radiative centers. Moreover, the term "quantum dot beads" is used to refer to particles that include a bead matrix (e.g., a polymer bead) into which a plurality of core quantum dot particles and/or core/shell quantum dot particles are incorporated. It should therefore be understood that the term "quantum dot particles" encompasses core quantum dot particles, core/shell quantum dot particles, and quantum dot beads unless otherwise indicated.

Some examples of suitable core quantum dot particles include powder or particulate forms of one or more luminescent semiconductor nanocrystals. Specific non-limiting examples of suitable core quantum dot particles include powdered or particulate forms of one or more of the following semiconductors: CdS, CdSe, CdTe, ZnS, ZnSe, ZnTe, InP, InAs, InSb, AlP, AlS, AlAs, AlSb, GaN, GaP, GaAs, GaSb, PbS, PbSe, Si, Ge and combinations thereof. In some embodiments, the wavelength converting compositions of the present disclosure include core/shell quantum dot particles including nanocrystalline indium phosphide. Without limitation, the quantum dot particles are preferably cadmium free.

Although the present disclosure envisions the use of core quantum dot particles such as those noted above alone, such particles may suffer from one or more drawbacks which may make them difficult to handle or process without materially impacting their ability to convert incident light. The core quantum dot particles may also exhibit relatively low quantum efficiencies due to non-radiative electron-hole recombination occurring at defects and dangling bonds in or at their surface. Exposure to moisture and oxygen may result in oxidation of the surface of the particle and may adversely modify their performance.

To address this issue, core quantum dot particles may be coated with one or more "shells" as noted above, so as to form core/shell quantum dot particles. In such particles, the "core" is a core quantum dot particle such as those noted above, and the "shell" is an inorganic and/or organic material that individually coats or encapsulates the core quantum dot particle. Suitable materials for the core of core/shell quantum dot particles include the core quantum dot particles noted above. Suitable materials for forming the shell(s) of a core/shell quantum dot particle include one or more nanocrystalline semiconductor materials having a larger bandgap than the core. Examples of such materials include ZnS and/or a combination of ZnSe and ZnS. Of course, other nanocrystalline semiconductor materials may be used as a shell of a core/shell quantum dot particle, provided that the shell material has a larger bandgap than the core.

The above noted shell materials may be applied to the core using any technique known in the art. By way of example, the core may be coated with one or more shells using wet chemical synthesis, successive ionic layer adsorption and reaction (SILAR), and the like. In any case the thickness of the shell may vary widely, and may range from about 1 to about 500 nm, such as about 10-500 nm, or even about 100 to about 500 nm. In some embodiments, one or more shells are formed around a core quantum dot particle. For example the core quantum dot particles may be coated with 1, 2, 3 or more shells, wherein each shell may be selected from the aforementioned shell materials.

In some embodiments the core quantum dot and/or core/shell quantum dot particles may be used and/or provided in the form of a colloidal dispersion, which may be added to a matrix precursor consistent with the present disclosure. Due to molecular interaction and/or other factors, a colloidal dispersion containing core or core/shell quantum dots may not settle or may not substantially settle within a matrix precursor, regardless of the density of the core or core/shell quantum dots contained therein. In such instances, the core and/or core/shell quantum dots in the first wavelength converting material may remain suspended during curing of the matrix precursor, whereas the second wavelength converting material (e.g., phosphor particles) may settle and/or float within the matrix precursor as it is cured.

Although the present disclosure contemplates the use of core quantum dot particles and core/shell quantum dot particles as wavelength converting particles, use of such particles is not required. Indeed in some embodiments the quantum dot particles of the present disclosure may be in the form of quantum dot beads, wherein each bead comprises a bead matrix that encapsulates a plurality of core quantum dot particles, core/shell quantum dot particles, or a combination thereof. In some embodiments the bead matrix is an optically transparent medium, such as but not limited to an optically transparent resin, polymer, monolith, glass, so gel, epoxy, silicone, (meth)acrylate or the like, or may include silica. Non-limiting examples of suitable bead matrix materials include acrylate polymers such as polymethyl(meth)acrylate, polybutylmethacrylate, polyoctylmethacrylate, alkylcyanoacryaltes, polyethyleneglycol dimethacrylate, lauryl methacrylate, polyvinylacetate etc., epoxides such as EPOTEK 301 A+B Thermal curing epoxy, EPOTEK OG112-4 single pot UV curing epoxy, or EX0135A and B Thermal curing epoxy, polyamides, polyimides, polyesters, polycarbonates, polythioethers, polyacrylonitryls, polydienes, polystyrene polybutadiene copolymers (Kratons), pyrelenes, poly-para-xylylene (parylenes), silica, silica-acrylate hybrids, polyetheretherketone (PEEK), polyvinylidene fluoride (PVDF), polydivinyl benzene, polyethylene, polypropylene, polyethylene terephthalate (PET), polyisobutylene (butyl rubber), polyisoprene, and cellulose derivatives (methyl cellulose, ethyl cellulose, hydroxypropylmethyl cellulose, hydroxypropylmethylcellulose phthalate, nitrocellulose, and combinations thereof.

Although a wide variety of bead matrixes are envisioned, use of a bead matrix that has a refractive index that significantly differs from that of the polymeric matrix material may introduce interfaces with polymeric matrix material that may scatter, reflect, and/or refract light within the wavelength converter. Therefore in some embodiments the bead matrix and/or polymeric matrix material is/are selected such that they have relatively close or even identical refractive indices. Therefore in some embodiments the polymeric matrix material may exhibit a first refractive index $n_1$, the bead matrix may exhibit a second refractive index $n_2$, and $n_1$ may differ from $n_2$ by less than or equal to 15%, 10%, 5%, 1%, or even 0.1%. In some embodiments, $n_1$ equals $n_2$. In some embodiments, the bead matrix exhibits an refractive index $n_1$ ranging from about 1.2 to about 2.1, such as above 1.4 to about 1.6, and the quantum dot beads exhibit an refractive index $n_2$ that is the same as $n_1$, or differs from $n_1$ within the foregoing ranges.

Like the core quantum dot particles, the quantum dot beads described herein may also be coated with one or more layers or shells of an inorganic or organic material, e.g., for the purpose of limiting contact of the quantum dot particles with oxygen. In this regard any suitable material may be used to coat the quantum dot beads, such as but not limited to the nitrides, oxides and organic materials identified above as being suitable for coating core quantum dot particles. Unlike the core quantum dot and/or core/shell quantum dot particles however, quantum dot beads may be used and/or provided in a powdered or particulate form. Moreover the beads may not interact with a matrix precursor in the same manner as a colloidal dispersion of core and/or core/shell quantum dots. As a result, the quantum dot beads described herein may settle, float, and/or remain suspended within a matrix precursor depending on their properties and the processing parameters applied to cure the matrix precursor.

As shown above a wide variety of core quantum dot particles, core/shell quantum dot particles, and quantum dot beads may be used as wavelength converting particles in wavelength converters consistent with the present disclosure. As specific non-limiting examples of suitable core quantum dot particles, core/shell quantum dot particles, and quantum dot beads that may be used, mention is made of the core quantum dot particles, core/shell quantum dot particles, and quantum dot beads described in U.S. Pre-Grant Publication No. 2013/0189803, the entire content of which is incorporated herein by reference. Without limitation, the quantum dot particles described herein are preferably one or more types of quantum dot beads.

The density of the quantum dot beads may impact the rate at which they settle in a matrix precursor, and thus their distribution within a cured polymeric matrix material. It may therefore be desirable to select quantum dot beads for use in the wavelength converting compositions described herein based not only on their optical performance but also their density, e.g., relative to a density of other wavelength converting particles such as the phosphor particles noted above. With this in mind in some embodiments quantum dot beads are used, and have a density ranging from about 1.0 to about 2.0 g/cm$^3$, such as about 1 to about 1.5 g/cm$^3$ or even about 1 to about 1.2 g/cm$^3$. In further non-limiting embodiments the quantum dot beads may be more or less dense than other wavelength converting particles within the polymeric matrix and matrix precursor, such as but not limited to the phosphor particles described above. For example, quantum dot beads may be used in some examples, and may have a density that is 2, 3, 4, 5 or more times less than that of the density of at least one other type of wavelength converting particles included in the wavelength converting composition (e.g., phosphor particles). In such instances the quantum dot beads may exhibit relatively slow (or no) settling in a polymeric matrix material, relative to the other type of wavelength converting particles.

The particle size and/or particle size distribution of the quantum dot beads may impact the rate at which they settle in a matrix precursor, and therefore may potentially affect their distribution within a cured polymeric matrix material. It may therefore be desirable to select quantum dot beads for use in the wavelength converting compositions described herein based at least in part on their particle size/distribution, either independently or in relation to the particle size/distribution of other wavelength converting particles that may be used (e.g., phosphor particles). In this regard the quantum dot beads noted above may have a particle size ranging from about 1 to about 750 microns, such as about 1 to about 100 microns or even about 1 to about 50 microns.

In these or other non-limiting embodiments the particle size of the quantum dot beads may be larger or smaller than another type of wavelength converting particles within the polymeric matrix and matrix precursor, such as but not limited to the phosphor particles noted above.

In some embodiments the wavelength converters may be formed by a wavelength converting composition including a polymeric matrix material that encapsulates at least one type of wavelength converting particles. For example the wavelength converters described herein may include at least first and second types of wavelength converting particles, wherein the first type of wavelength converting particles include phosphor particles selected from those described above, and the second type of wavelength converting particles include at least one of quantum dot particles such as the quantum dot beads described above. Without limitation, the first type of wavelength converting particles preferably include a plurality of at least one of the phosphor particles described above, and the second type of wavelength converting particles preferably include a plurality of at least one of the quantum dot beads described above. In some embodiments, mint green broadband phosphor particles may be used in combination with red quantum dot beads to produce a warm white light from a light source such as an LED. In other non-limiting embodiments, yellow broadband phosphor particles may be used in combination with green and/or red quantum dot beads, which may broaden the white light spectrum. It should therefore be understood that the quantum dot beads described herein may be used to tune or adjust the light output produced by a light source and/or phosphor particles.

In any case the first and second types of wavelength converting particles may have the same or different settling rate in a matrix precursor of the polymeric matrix material. Without limitation, the first type of wavelength converting particles (e.g., phosphor particles) preferably have a first settling rate in the matrix precursor and the second type of wavelength converting particles (e.g., quantum dot particles such as quantum dot beads) preferably have a second settling rate in the matrix precursor, wherein the first settling rate is greater than the second settling rate. In another embodiment, the second settling rate is preferably greater than the first settling rate.

The total amount of wavelength converting particles in the wavelength converting compositions described herein may vary widely. In some embodiments, the wavelength converting particles may range from about 1 to about 70% by weight, such as about 1 to about 50%, about 5 to about 40%, about 10 to about 30%, or even about 20 weight %, relative to the total weight of the wavelength converting composition.

In some embodiments the wavelength converting compositions described herein include first and second types of wavelength converting particles, wherein the first type of wavelength converting particles include phosphor particles and the second type of wavelength converting particles include quantum dot particles (e.g. in the form of core quantum dot particles, core/shell quantum dot particles, and quantum dot beads). In such instances the amounts of phosphor particles and quantum dot particles may vary widely, either independently or with respect to one another. In such instances the quantum dot particles may be present in an amount ranging from about 10 to about 50 weight % (e.g., about 10 to about 40 weight % or even about 10 to about 20 weight %), relative to the total weight of the wavelength converting composition, and the phosphor particles may be present in an amount ranging from about 1 to about 20 weight % (such as about 10 to about 20 weight %) of the wavelength converting composition.

The distribution of the wavelength converting particles in the wavelength converters described herein (or, more specifically, within the polymeric matrix material thereof) may vary widely. Although not limited to wavelength converters that include any particular distribution of wavelength converting particles, for the sake of illustration the present disclosure will now proceed to describe several example single layer wavelength converters that include at least first and second types of wavelength converting particles that are present in a polymeric matrix material. It should be understood the described configurations are illustrative only, and that the present disclosure encompasses embodiments wherein a wavelength converter containing a one, two, three, four, or more types of wavelength converting particles are used, and are present in a single layer of a polymeric matrix material, with each type of wavelength converting particle being distributed within the polymeric matrix in a desired fashion.

Figure 2A:
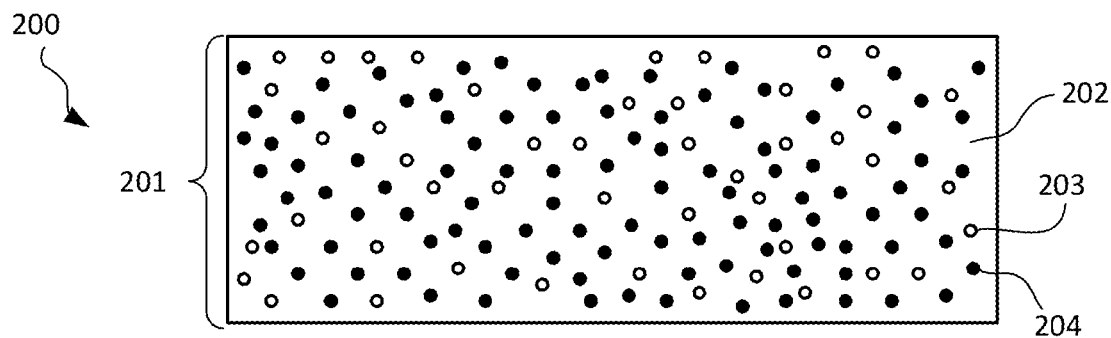
FIG. 2A-2E illustrate cross sectional views of several examples of single layer wavelength converters consistent with the present disclosure.

Reference is now made to FIG. 2A, which depicts one example of a wavelength converter consistent with the present disclosure. As shown, wavelength converter 200 includes a single layer 201 of a polymeric matrix material 202. Polymeric matrix material 202 includes first wavelength converting particles 203 and second wavelength converting particles 204. In some embodiments first wavelength converting particles 203 may include at least one type of phosphor particles, and second wavelength converting particles 204 may include at least one type of quantum dot particles, such as those described above. Without limitation, second wavelength converting particles 204 are preferably selected from core/shell quantum dot particles, quantum dot beads, or a combination thereof. As shown in this embodiment, first and second wavelength converting particles 203, 204 are distributed substantially homogenously throughout polymeric matrix material 202.

Figure 2B:
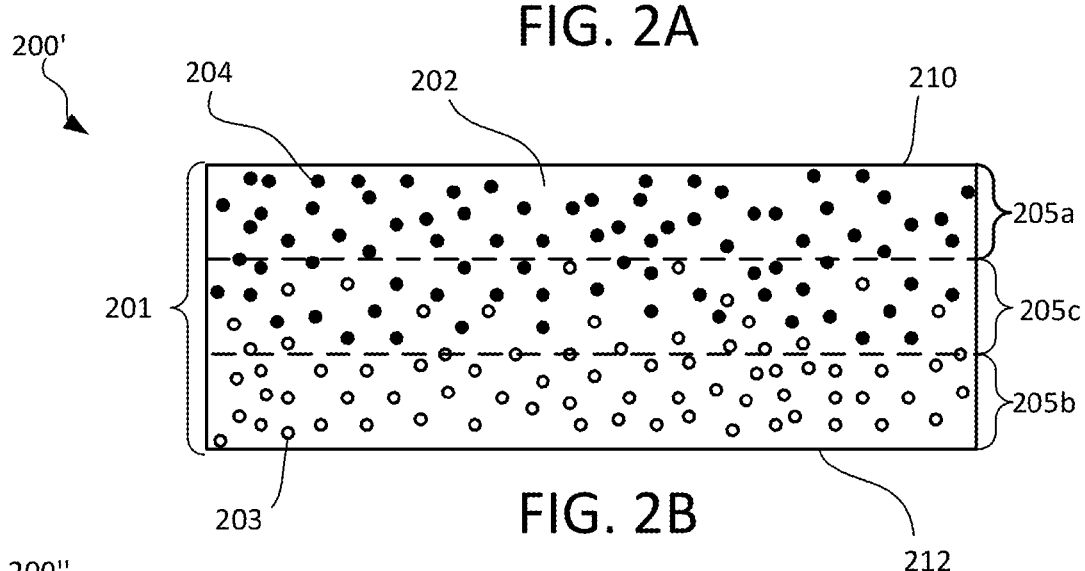

FIG. 2B depicts another example of a wavelength converter consistent with the present disclosure. As shown, wavelength converter 200' includes single layer 201 of polymeric matrix material 202, as well as first and second wavelength converting particles 203, 204, the nature and function of which have been previously described. In addition, single layer 201 may include a first region 205a, a second region 205b, and an intermediate region 205c between first and second regions 205a and 205b. As shown, first and second wavelength converting particles 203, 204 are distributed such that first region 205a has a relatively high concentration of second wavelength converting particles 204, relative to second region 205b and intermediate region 205c. In contrast, second region 205b has a relatively high concentration of first wavelength converting particles 203, relative to first region 205a and intermediate regions 205c. Therefore in this embodiment the concentration of first wavelength converting particles 203 is relatively high near the lower surface 212 of single layer 201, and the concentration of second wavelength converting particles 204 is relatively high near the upper surface 210 of single layer 201.

In FIG. 2B, intermediate region 205c contains both first and second wavelength converting particles 203, 204. In some embodiments the respective concentrations of first and second wavelength converting particles 203, 204 in intermediate region 205c may be less than the respective concentrations of such particles in first and second regions 205a and 205b. In further embodiments, the first wavelength converting particles 203 are distributed such that their concentration gradually decreases with increasing distance from second region 205b or, more particularly, with increased distance from the lower surface 212 of single layer 201. Alternatively or additionally, the distribution of second wavelength converting particles 204 may be such that the concentration of such particles gradually decreases with increasing distance from first region 205a or, more particularly, with increased distance from the upper surface 210 of single layer 201. In other words, a concentration gradient of the first and/or second wavelength converting particles 203, 204 may exist within intermediate region 205c.

Figure 2C:
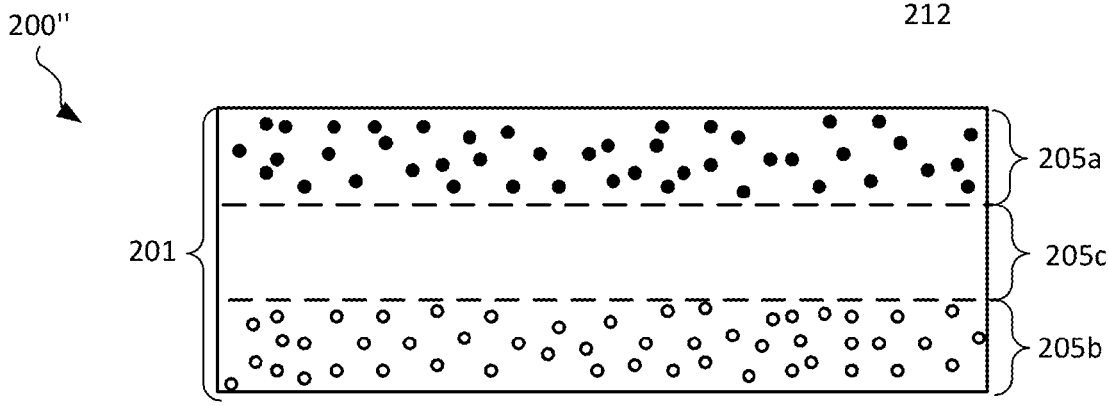

FIG. 2C depicts another example of a wavelength converter consistent with the present disclosure. As wavelength converter 200" includes many of the same elements as wavelength converters 200 and 200', such components are not described again for the sake of brevity. Like FIG. 2B, first wavelength converting particles 203 and second wavelength converting particles 204 are distributed such that their respective concentrations are relatively high in first and second regions 205a and 205b, respectively. Unlike FIG. 2B however, in FIG. 2C first and second wavelength converting particles are absent or substantially absent from intermediate region 205c. In some embodiments, intermediate region 205c does not contain one or both of first wavelength converting particles 203 and second wavelength converting particles 204.

Figure 2D:
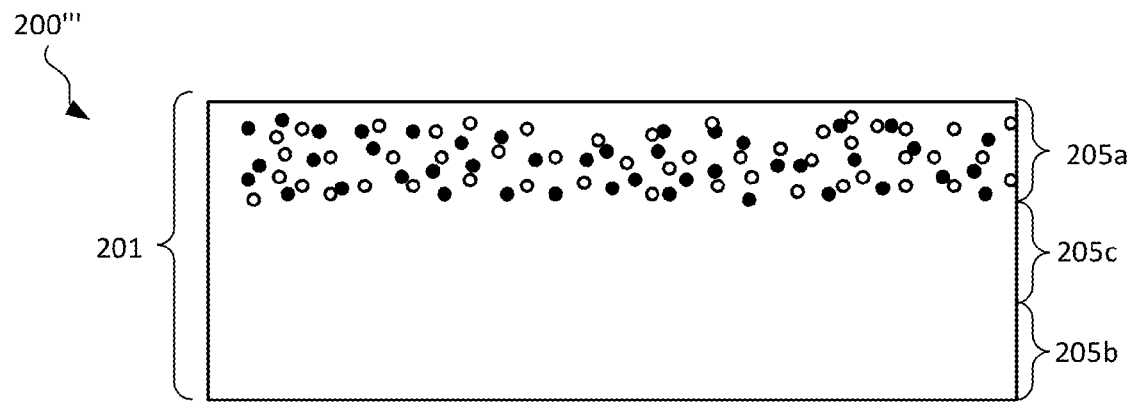

FIG. 2D depicts another example of a wavelength converter consistent with the present disclosure. As wavelength converter 200''' includes many of the same elements as wavelength converters 200, 200', and 200", such components are not described again for the sake of brevity. As shown in this embodiment, first wavelength converting particles 203 and second wavelength converting particles 204 are distributed such that their respective concentrations are localized in first region 205a. In contrast, first and second wavelength converting particles 203, 204 in this embodiment are absent or substantially absent from second region 205b and intermediate region 205c.

Figure 2E:
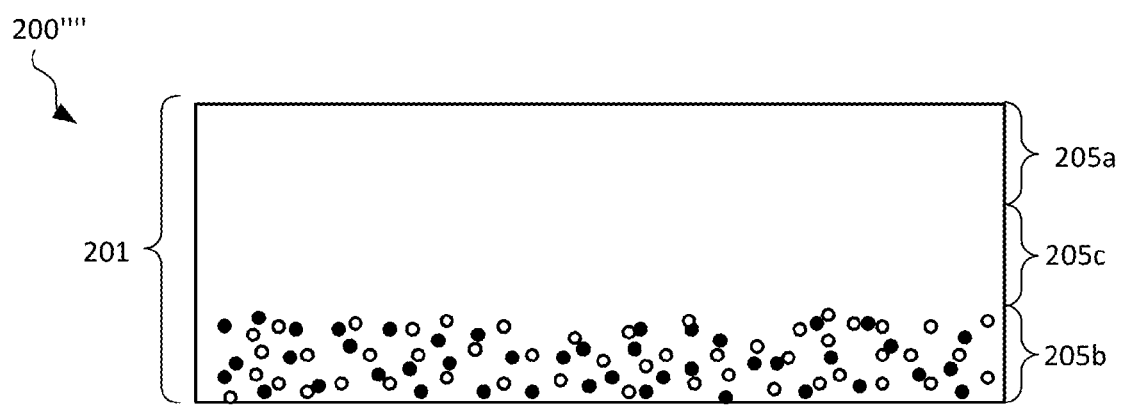

FIG. 2E depicts yet another example of a wavelength converter consistent with the present disclosure. As shown wavelength converter 200'''' includes many of the same elements as wavelength converters 200, 200', 200", and 200''', and such components are therefore not described again for the sake of brevity. In this embodiment, first wavelength converting particles 203 and second wavelength converting particles 204 are distributed such that their respective concentrations are localized in second region 205b. In contrast, first and second wavelength converting particles 203, 204 in this embodiment are absent or substantially absent from first region 205a and intermediate region 205c.

It should be understood that the orientation of the single layer wavelength converters shown in FIGS. 2A-E is for the sake of illustration only, and that the orientation of the converter may be set (relative to a light source) as desired. In some embodiments, the converters shown in FIGS. 2A-E are oriented such that a surface proximate region 205(b) is oriented towards a light source, and a surface proximate region 205(a) is oriented away from the light source, e.g., as generally shown in FIGS. 2A-E. Alternatively, in some embodiments the converters shown in FIGS. 2A-E are oriented such that a surface proximate region 205(b) is oriented away from a light source, and a surface proximate region 205(a) is oriented towards the light source, i.e., such that the orientation shown in FIGS. 2A-E is flipped.

Another aspect of the present disclosure relates to light sources that include a wavelength converter consistent with the present disclosure. Although the present disclosure contemplates the use of the wavelength converters and wavelength converting compositions in a wide variety of light sources, such converters and converting compositions may be particularly suitable for use in solid state light sources such as a light emitting diode package. In such application, the wavelength converters described herein may convert at least a portion of incident primary light emitted from a light emitting diode to secondary light.

Figure 3:
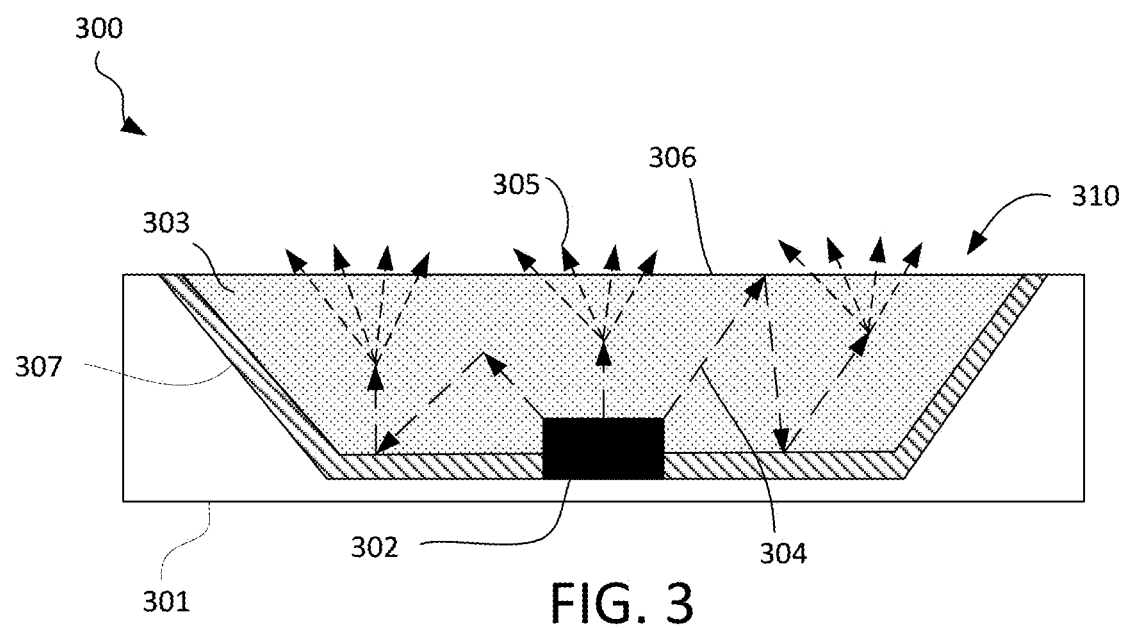
FIG. 3 is a cross sectional view of an LED package including a single layer wavelength converter consistent with the present disclosure.

Reference is therefore made to FIG. 3, which depicts one example of a light source (e.g., an LED lighting package) including a wavelength converter consistent with the present disclosure. As shown, LED lighting package 300 includes LED frame 301, LED 302, wavelength converter 303, and optional reflector 307. LED frame 301 includes a cavity (not labeled) in which LED 302 is disposed. Wavelength converter 303 is disposed within the aperture of LED lighting package 300 and is in contact with the light emitting surface of LED 302.

LED frame 301 may be any frame that is suitable for supporting LED 302, wavelength converter 303, and optional reflector 307. In some embodiments, LED frame 301 may be a circuit board containing electrical circuits, contacts, etc. for driving LED 302. Alternatively or additionally, LED frame 301 may be a support structure that provides mechanical support for other components in LED lighting package 300.

LED 302 may be any LED that is capable of emitting primary light from a light emitting surface thereof. Although LEDS that emit primary light in the blue region are preferred, LEDs that emit primary light in other regions of the spectrum may also be used. Regardless of its nature, LED 302 may emit primary light 304 from an emitting surface thereof (not labeled). Primary light 304 may be emitted from LED 302 in any direction, but preferably towards the aperture 310 of LED lighting package 300. Subsequent to emission by LED 302, primary light 304 may impinge on wavelength converter 303.

Consistent with the foregoing discussion, wavelength converter 303 may include a polymeric matrix material encapsulating one or more types of wavelength converting particles, such as a plurality of phosphor particles that are capable of converting primary light 304 to secondary light (not labeled), and quantum dot particles that are capable of converting primary light 304 and/or secondary light to tertiary light (not labeled). Collective light output 305 may thus be emitted from LED package 300, and may include a mixture of unconverted primary, secondary, and/or tertiary light. In some embodiments, LED 302 emits primary light 304 in the ultraviolet, or visible region of the electromagnetic spectrum, and wavelength converter 303 includes a single layer of a polymeric matrix material and first and second wavelength converting particles, as discussed above. Any distribution of wavelength converting particles within the single layer may be used, such as but not limited to the distributions shown in FIGS. 2A-2E.

Optional reflector 307 may be used to redirect primary, secondary and/or tertiary light that may be backscattered or reflected by wavelength converter 303, the wavelength converting particles therein, and/or by polymer air interface 306 back towards the aperture 310 of LED lighting package 300, as generally shown in FIG. 3. In this regard any suitable reflector may be used as optional reflector 307, provided that it can reflect a sufficient quantity of incident primary, secondary, and/or tertiary light. In some embodiments optional reflector 307 is preferably configured to reflect greater than or equal to about 75%, 85%, 95%, or even 99% of incident primary, secondary and/or tertiary light.

The embodiment of FIG. 3 illustrates LED lighting package 300 as including a wavelength converter 303 that is disposed adjacent or in contact with a light emitting surface (not labeled) of LED 302. Such a configuration may be understood in the art as a chip level conversion configuration. It should be understood that this configuration is illustrative only, and that an LED package may be configured in another manner. For example, wavelength converter 303 may be arranged some distance from the light emitting surface of LED 302, i.e., in a remote phosphor configuration. Moreover it should be understood that the number of LEDs in the LED packages described herein is not limited to one, as shown in the embodiment of FIG. 3. Indeed, the present disclosure envisions and encompasses embodiments wherein a plurality (e.g., 2, 3, 4, etc.) of LEDs are used. Apart from these differences the LED packages may otherwise operate in generally the same manner as described above with respect the embodiment of FIG. 3

Figure 4:
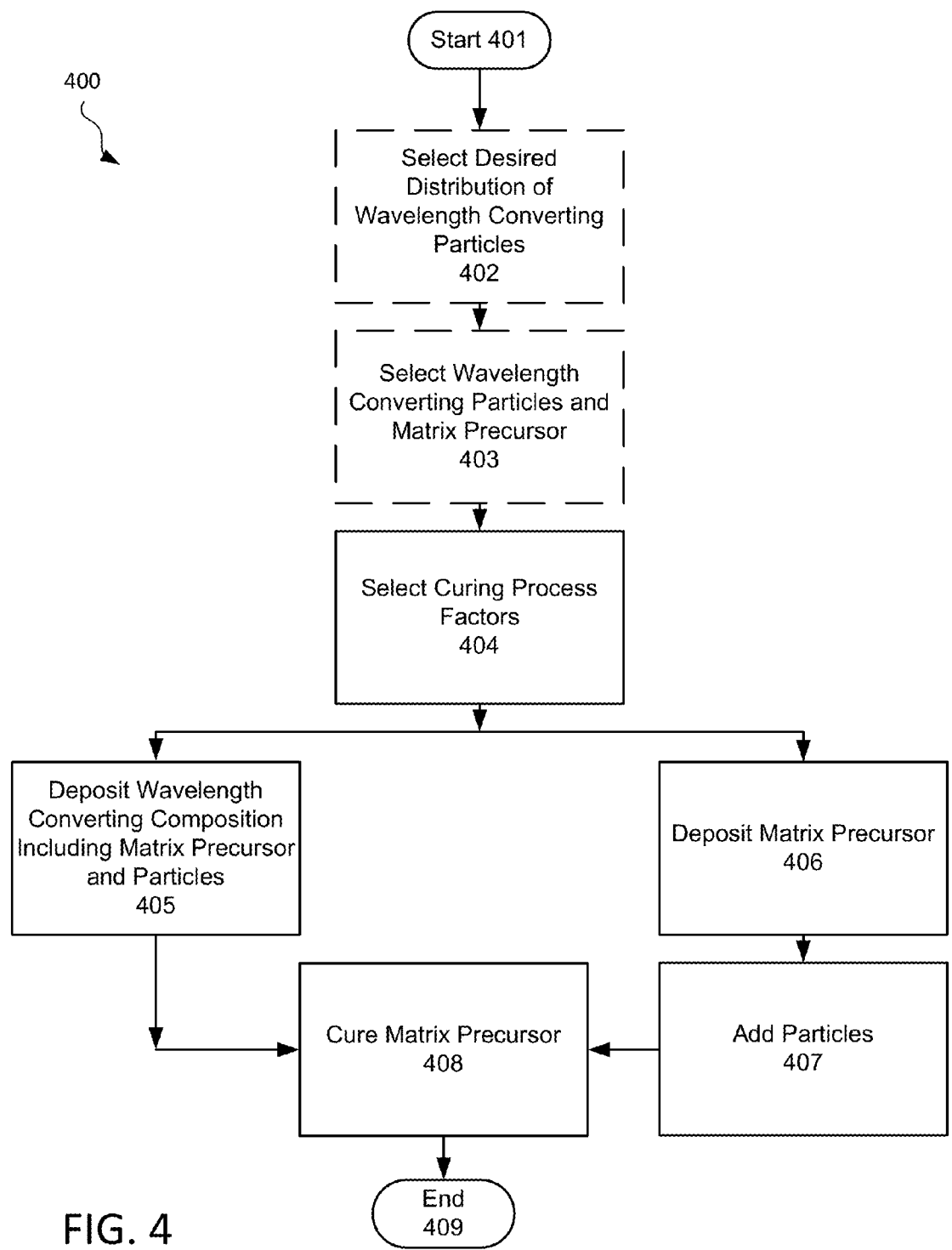
FIG. 4 is a flow chart depicting example operations of a method of making a single layer wavelength converter consistent with the present disclosure.

Yet another aspect of the present disclosure relates to methods of manufacturing single layer wavelength converters such as those described above, as well LED lighting packages including such wavelength converters. In this regard reference is made to FIG. 4., which is a flowchart of example operations that may be performed in accordance with one embodiment of a method consistent with the present disclosure. As shown, method 400 begins at block 401. The method may then proceed to optional block 402, wherein a distribution of wavelength converting particles in a polymeric matrix material may be selected. For example in instances where a wavelength converter containing at least first and second wavelength converting particles is to be formed, one of the first and second wavelength converting particle distributions shown in FIGS. 2A-2E may be selected. Of course, selection of wavelength converting particle distribution is not limited to the distributions shown in FIGS. 2A-2E, and any suitable distribution may be used.

Once a wavelength converting particle distribution is selected or if such a selection is not required, the method may proceed to optional block 403, wherein materials for the matrix precursor and suitable wavelength converting particles may be selected. Consistent with the foregoing description and as will be explained further below, selection of materials for use as the matrix precursor and wavelength converting particles may depend not only desired optical properties, but also the impact of the material and physical properties on such material on the ability of the wavelength converting particles to sink, float, or remain suspended within the matrix precursor, e.g., on the settling rate of such particles.

Once the selection of such materials is complete or if such selection is not required, the method may proceed to block 404, wherein curing process factors may be selected. As used herein, "curing process factors" refers to one or more process parameters that are applied during curing of a matrix precursor to form a polymeric matrix material. Among other things, curing process factors may include the settling rate of the wavelength converting particles, viscosity of the matrix precursor, curing temperature (in instances where the matrix precursor is thermally curable and exhibits a gel time (cure rate) that is impacted by temperature), curing light intensity (in instances where the matrix precursor is photopolymerizable and exhibits a gel time (cure rate) that is impacted by light intensity), combinations thereof, and the like.

In instances where the matrix precursor is a thermally curable and exhibits gel time (cure rate) that varies with curing temperature, the curing temperature may be selected pursuant to block 404 so as control the gel time (cure rate) of the matrix precursor. One purpose of controlling the gel time (cure rate) is to control the amount of time that the wavelength converting particles have to sink (settle) or float within the matrix precursor. For example, a thermally curable matrix precursor may exhibit a first (nominal) gel time (cure rate) when cured at a first (nominal) curing temperature. Increasing the curing temperature above the first curing temperature may decrease the gel time (increase cure rate) of the matrix precursor, resulting in a corresponding decrease in the amount of time wavelength converting particles within the matrix precursor have to sink or float. Conversely reducing the curing temperature below the first curing temperature may extend the gel time (reduce the cure rate) of the matrix precursor, resulting in a corresponding increase in the amount of time that wavelength converting particles within the matrix precursor have to sink, remain suspended, or float. When the matrix precursor is photopolymerizable, similar control over the time in which wavelength converting particles may sink, remain suspended or float may be obtained by adjusting the curing light intensity relative to a first nominal curing light intensity.

As may be appreciated, selection of the wavelength converting particles and selection of the curing process factors may depend on the desired distribution of wavelength converting particles in the wavelength converter under consideration, as well as the manner in which the selected materials are to be compounded and converted into a wavelength converter consistent with the present disclosure. In this regard is it noted that at least two options exist for compounding and converting the matrix precursor and wavelength converting particles into a wavelength converter.

In a first option, a mixture, emulsion, and/or suspension of wavelength converting particles in the matrix precursor may be formed and deposited onto a substrate. In another, second option, the matrix precursor material may be deposited on a substrate, after which wavelength converting particles may be added to it. In either case, it should be understood that when the wavelength converting particles include quantum dot beads, such beads may be added to the matrix precursor in a powdered or particulate form. When core or core/shell quantum dot particles are included in the wavelength converting particles, they may be added to the matrix precursor in the form of a colloidal dispersion of such particles. Regardless when the first option is used, the wavelength converting particles will (assuming good mixing) initially be substantially homogenously dispersed in the matrix precursor, e.g., such that the distribution of such particles is similar to that shown in FIG. 2A. When the second option is used, the wavelength converting particles may be initially distributed proximate an upper surface of the matrix precursor, e.g., in a manner similar to the distribution shown in FIG. 2D. In either case, any of the wavelength converting particle distributions shown in FIGS. 2A-2E may be obtained through appropriate selection of matrix material, wavelength converting particles, and curing process factors.

For the sake of illustration the present disclosure will now proceed to describe various example operations that may be performed to produce wavelength converters that include first and second wavelength converting particles that are distributed in polymeric matrix material in a manner consistent with the distributions shown in FIGS. 2A-E. Initially a first set of example embodiments will be described to demonstrate the production of wavelength converters having the distributions shown in FIGS. 2A-E, assuming an initial particle distribution consistent with FIG. 2A (e.g., when a mixture, emulsion or suspension of wavelength converting particles in a matrix precursor is initially deposited. A second set of example embodiments will then be described to demonstrate the production of such wavelength converters, assuming an initial particle distribution consistent with FIG. 2D (e.g., when wavelength converting particles are added to a previously deposited matrix precursor).

With regard to the first set of example embodiments, the method may proceed from block 404 to block 405, wherein a mixture, emulsion or suspension of first and second wavelength converting particles 203, 204 in matrix precursor of polymeric matrix material 202 is formed and deposited onto a substrate, such as a light emitting diode. Deposition of the mixture, emulsion, or suspension may be accomplished using any suitable method known in the art, including spin coating, drop casting, extrusion, molding, combinations thereof, and the like. Assuming good mixing, the first and second wavelength converting particles 203, 204 may be initially distributed substantially homogenously within the matrix precursor, e.g., in a manner similar to that of FIG. 2A.

As noted previously, through appropriate selection of the matrix precursor, first and second wavelength converting particles, and curing process parameters, it is possible to achieve any of the particle distributions shown in FIGS. 2A-2E. For example the particle distribution shown in FIG. 2A may be obtained by selecting first and second wavelength converting particles 203, 204 that do not substantially sink or float within the matrix precursor during the curing process. In this regard, settling and/or floating of the first and second wavelength converting particles 203, 204 may be limited or prevented by selecting first and second wavelength converting particles 203, 204 that exhibit relatively slow settling rates in the matrix precursor. For example, where the wavelength converting particles include core and/or core/shell quantum dots as described above, such particles may be added to the matrix precursor in the form of a colloidal dispersion that does not settle or does not substantially settle in the matrix precursor. In such instances, the core and/or core/shell quantum dot particles may remain substantially homogenously dispersed in the matrix precursor regardless of the curing parameters applied.

Alternatively or additionally, in instances where one or more of the first and second wavelength converting particles settle and/or floating in the matrix precursor (e.g., in the case of quantum dot beads and/or phosphor particles), settling of the first and second wavelength converting particles 203, 204 may be limited by reducing the gel time (i.e., increase the cure rate) of the matrix precursor, e.g., by increasing curing temperature (in the case of a thermally cured matrix precursor), adding additional polymerization catalyst (if used), increasing curing light intensity (in the case of a photopolymerizable matrix precursor), or a combination thereof. By way of example, in some embodiments the silicone elastomer known as SYLGARD 184 sold by Dow Corning may be used as a polymeric matrix material. In such instances, cure time could be adjusted by adjusting the cure temperature and/or amount of polymerization catalyst added.

From the initial distribution of FIG. 2A, a wavelength converter having the wavelength converting particle distribution shown in FIG. 2B may be obtained in part by selecting a first wavelength converting particles 203 that have a first settling rate and second wavelength converting particles 204 having a second settling rate in a matrix precursor, wherein the first settling rate is relatively fast compared to that of the second settling rate, and the first and second settling rates indicate that both the first and second types of wavelength converting particles will settle in the matrix precursor over time. Due to the difference in first and second settling rates, first wavelength converting particles 203 (e.g., phosphor particles) will sink within the matrix precursor faster than second wavelength converting particles 204 (e.g., quantum dot beads), provided they are given sufficient time to do so. With this in mind, the distribution shown in FIG. 2B may be obtained by curing the matrix precursor (pursuant to block 408) using process conditions that provide sufficient time to allow first and second wavelength converting particles to significantly (but not totally) separate. As noted above, this may be accomplished by appropriately setting or controlling the process parameters used to cure the matrix precursor, such as the curing temperature and/or curing light intensity.

From the initial distribution shown in FIG. 2A, a wavelength converter having the wavelength converting particle distribution shown in FIG. 2C may be obtained by selecting first wavelength converting particles 203 (e.g., phosphor particles) that will settle in the matrix precursor, and second wavelength converting particles 204 (e.g., quantum dot beads) that will float (i.e., rise toward an upper surface) of the matrix precursor, provided they are given sufficient time to do so. Once the initial distribution shown in FIG. 2A is attained (e.g., by good mixing of the particles and matrix precursor), the distribution of FIG. 2C may be obtained by curing the matrix precursor (pursuant to block 408) under curing process conditions that provide sufficient time for the first and second wavelength converting particles to completely separate within the matrix precursor. In some embodiments this may be accomplished by delaying curing of the matrix precursor for a time that is sufficient to allow first and second wavelength converting particles to separate, after which the matrix precursor may be cured in any suitable fashion. Alternatively, curing may be initiated after initial deposition of the matrix precursor and particles, but the curing process parameters may be set such that gel time of the matrix precursor is extended (cure rate is lowered) for a sufficient time to enable full separation of first and second wavelength converting particles 203, 204.

From the initial distribution shown in FIG. 2A, a wavelength converter having the wavelength converting particle distribution shown in FIG. 2D may be obtained by selecting first wavelength converting particles 203 that will float (i.e., rise toward an upper surface) of the matrix precursor, such as may be attained with certain types of phosphor particles and quantum dot beads. Once the initial distribution shown in FIG. 2A is attained (e.g., by good mixing of the particles and matrix precursor), the distribution of FIG. 2D may be obtained by curing the matrix precursor (pursuant to block 408) under curing process conditions that provide sufficient time for the first and second wavelength converting particles 203, 204 to float out of second region 205b and/or intermediate region 205c and into first region 205a. In some embodiments this may be accomplished by delaying curing of the matrix precursor for a time that is sufficient to allow first and second wavelength converting particles to float into first region 205a, after which the matrix precursor may be cured in any suitable fashion. Alternatively, curing may be initiated after initial deposition of the matrix precursor and particles, but the curing process parameters may be set such that gel time of the matrix precursor is extended (cure rate is lowered) for a sufficient time to enable first and second wavelength converting particles 203, 204 to float into first region 205a.

From the initial distribution shown in FIG. 2A, a wavelength converter having the wavelength converting particle distribution shown in FIG. 2E may be obtained by selecting first and second wavelength converting particles 203, 204 (e.g., certain types of quantum dot beads and phosphor particles) that will settle toward a lower surface of the matrix precursor, provided they are given sufficient time to do so. Once the initial distribution shown in FIG. 2A is attained (e.g., by good mixing of the particles and matrix precursor), the distribution of FIG. 2E may be obtained by curing the matrix precursor (pursuant to block 408) under curing process conditions that provide sufficient time for the first and second wavelength converting particles 203, 204 to settle out of first and intermediate regions 205a and 205c, and into second region 205b. In some embodiments this may be accomplished by delaying curing of the matrix precursor for a time that is sufficient to allow first and second wavelength converting particles to settle into second region 205b, after which the matrix precursor may be cured in any suitable fashion. Alternatively, curing may be initiated after initial deposition of the matrix precursor and particles, but the curing process parameters may be set such that gel time of the matrix precursor is extended (cure rate is lowered) for a sufficient time to enable first and second wavelength converting particles 203, 204 to settle into second region 205b.

With regard to the second set of example embodiments, the method may proceed from block 404 to block 406, wherein a matrix precursor that does not contain wavelength converting particles may be deposited onto a substrate. Deposition of the matrix precursor accomplished using any suitable method known in the art, such as those noted above for the first set of example embodiments. Subsequent to deposition of the matrix precursor, first and second wavelength converting particles 203, 204 may be added to the matrix precursor. As a result, in the second set of example embodiments the first and second wavelength converting particles 203, 204 may be initially distributed proximate an upper surface of the matrix precursor, e.g., in first region 205a as shown in FIG. 2D.

In alternative embodiments the distributions shown in FIGS. 2A-2C and 2E may be obtained from an initial distribution consistent with FIG. 2D. For example, from the initial distribution of FIG. 2D a wavelength converter having the wavelength converting particle distribution shown in FIG. 2B may be obtained in part by selecting a first wavelength converting particles 203 (e.g., phosphor particles) that have a first settling rate and second wavelength converting particles 204 (e.g., quantum dot beads) having a second settling rate in a matrix precursor, wherein the first settling rate is relatively fast compared to that of the second settling rate. Due to the difference in first and second settling rates, first wavelength converting particles 203 will sink within the matrix precursor faster than second wavelength converting particles 204, provided they are given sufficient time to do so. With this in mind, the distribution shown in FIG. 2B may be obtained by curing the matrix precursor (pursuant to block 408) using process conditions that provide sufficient time to allow first and second wavelength converting particles to settle from first region 205a into one or both of second and intermediate regions 205b, 205c, and to significantly (but not totally) separate. As noted above, this may be accomplished by appropriately setting or controlling the process parameters used to cure the matrix precursor, such as the curing temperature and/or curing light intensity.

From the initial distribution of FIG. 2D, a wavelength converter having the wavelength converting particle distribution shown in FIG. 2C may be obtained by selecting first wavelength converting particles 203 (e.g., phosphor particles) that will settle in the matrix precursor (provided sufficient time), and second wavelength converting particles (e.g., core quantum dot particles, core/shell quantum dot particles and/or quantum dot beads) that will remain suspended and/or float (i.e., rise toward an upper surface) of the matrix precursor (again, provided sufficient time). For example once an initial distribution shown in FIG. 2D is attained, the distribution of FIG. 2C may be obtained by curing the matrix precursor (pursuant to block 408) under curing process conditions that provide sufficient time for the first wavelength converting particles 203 to sink into second region 205b and completely separate from second wavelength converting particles 204, which remain in first region 205a.

In some embodiments this may be accomplished by selecting first wavelength converting particles 203 (e.g. phosphor particles) that will sink in the matrix precursor, selecting second wavelength converting particles 204 that will float or remain suspended ((e.g., core quantum dot particles, core/shell quantum dot particles and/or quantum dot beads), or which may sink slowly (e.g., quantum dot beads) in the matrix precursor (relative to first wavelength converting particles 203) and delaying curing of the matrix precursor for a time that is sufficient to allow first wavelength converting particles to settle into region 205b, while maintaining second wavelength converting particles within first region 205a. After complete separation of the wavelength converting particles, the matrix precursor may be cured in any suitable fashion. Alternatively, curing may be initiated after initial addition of the wavelength converting particles to the matrix precursor, but the curing process parameters may be set such that gel time of the matrix precursor is extended (cure rate is lowered) for a sufficient time to enable full separation of first and second wavelength converting particles 203, 204.

From the initial distribution of FIG. 2D, a wavelength converter having the wavelength converting particle distribution shown in FIG. 2A may be obtained by selecting first wavelength converting particles 203 (e.g., phosphor particles) and second wavelength converting particles 204 (e.g., quantum dot beads) that exhibit substantially similar or the same settling rate within the matrix precursor, and providing sufficient time for the first and second wavelength converting particles to partially settle out of first region 205a and into second and intermediate regions 205b, 205c. This may be accomplished for example by delaying curing of the matrix precursor until sufficient time has passed for a portion of the wavelength converting particles to migrate into second and intermediate regions 205b, 205c, after which the matrix precursor may be rapidly cured. Alternatively, curing may be initiated once the initial distribution of FIG. 2D is attained, but the curing process parameters may be set such that cure time is sufficient to enable migration of first and second wavelength converting particles 203, 204 from first region 205(a) into other regions, as discussed above.

From the initial distribution shown in FIG. 2D, a wavelength converter having the wavelength converting particle distribution shown in FIG. 2E may be obtained by selecting first wavelength converting particles 203 (e.g., phosphor particles) and second wavelength converting particles 204 (e.g., quantum dot beads) that will both sink (i.e., settle toward a lower surface) of the matrix precursor, provided they are given sufficient time to do so. Once the initial distribution shown in FIG. 2D is attained, the distribution of FIG. 2E may be obtained by curing the matrix precursor (pursuant to block 408) under curing process conditions that provide sufficient time for the first and second wavelength converting particles 203, 204 to settle out of first region 205a and into second region 205b. In some embodiments this may be accomplished by delaying curing of the matrix precursor for a time that is sufficient to allow first and second wavelength converting particles to sink into second region 205b, after which the matrix precursor may be cured in any suitable fashion. Alternatively, curing may be initiated after initial deposition of the matrix precursor and particles, but the curing process parameters may be set such that gel time of the matrix precursor is extended (cure rate is lowered) for a sufficient time to enable first and second wavelength converting particles 203, 204 to settle into second region 205b.

EXAMPLES

For the sake of illustration the present disclosure will now proceed to describe several examples in which a combination of wavelength converting particles are used to form a single layer wavelength converter consistent with the present disclosure. It should be understood that the following examples are representative only, and should not be considered to represent then entire scope of the invention described herein.

Example 1

In this example a single layer wavelength converter was made using SYLGARD 184 (made by Dow Corning) as a polymeric matrix material, green broadband phosphor particles, and red quantum dot beads. The uncured polymeric matrix material (matrix precursor) had a viscosity of 3500 centipoise (cP). The green phosphor particles had a peak emission at about 530 nm, and had a particle size of about 30 microns. The particle size of the red quantum dot beads was about 50 microns. The green phosphor particles and red quantum dot particles were mixed with the matrix precursor. The resulting mixture was deposited on a substrate and cured for 48 hours at room temperature. Subsequent inspection revealed the formation of a single layer wavelength converter having a wavelength converting particle distribution consistent with FIG. 2C, i.e., in which the red quantum dot beads were located in a first region (e.g., 205a) of the polymeric matrix material and the green phosphor particles were located in a second region (e.g., 205b) of the polymeric matrix material.

Example 2

In this example a single layer wavelength converter was made using the same polymeric matrix material and matrix precursor as example 1. In this example however particles of a yellow broadband phosphor was used in combination with red and green narrow band emission quantum dot beads. The yellow broadband phosphor particles exhibited a peak emission around 580 nm and had a particle size of about 30 microns. The red quantum dot beads exhibited a peak emission around 620 nm and had a particle size of about 50 microns. The green quantum dot beads exhibited a peak emission around 526 nm and had a particle size of about 50 microns. The phosphor particles and quantum dot beads were added to the matrix precursor and mixed. The resulting mixture was deposited and cured at room temperature for 48 hours. Subsequent inspection revealed the formation of a single layer wavelength converter having a wavelength converting particle distribution consistent with FIG. 2C, i.e., in which the red and green quantum dot beads were located in a first region (e.g., 205*a*) of the polymeric matrix material and the yellow phosphor particles were located in a second region (e.g., 205*b*) of the polymeric matrix material.

Example 3

In this example a single layer wavelength converter was made using the same polymeric matrix material as examples 1 and 2 Like examples 1 and 2, a combination of phosphor particles and quantum dot beads was also used. In this example, the phosphor particles and quantum dot particles were added to the matrix precursor and mixed. A polymerization catalyst (part B of Sylgard 184) and a supplement of platinum catalyst enabling curing within less than about 10 min was then added to the mixture. The resulting composition was then deposited and cured at room temperature. Curing proceeded quickly relative to the curing of examples 1 and 2. Subsequent inspection revealed the formation of a single layer wavelength converted having a wavelength converting particle distribution consistent with FIG. 2*a*, i.e., in which the phosphor particles and quantum dot beads were relatively uniformly dispersed throughout the thickness of the wavelength converter.

Other than in the examples, or where otherwise indicated, all numbers expressing endpoints of ranges, and so forth used in the specification and claims are to be understood as being modified in all instances by the term "about." Accordingly, unless indicated to the contrary, the numerical parameters set forth in the specification and attached claims are approximations that may vary depending upon the desired properties sought to be obtained by the present disclosure. At the very least, and not as an attempt to limit the application of the doctrine of equivalents to the scope of the claims, each numerical parameter should be construed in light of the number of significant digits and ordinary rounding approaches.

Notwithstanding that the numerical ranges and parameters setting forth the broad scope of the present disclosure are approximations, unless otherwise indicated the numerical values set forth in the specific examples are reported as precisely as possible. Any numerical value, however, inherently contains certain errors necessarily resulting from the standard deviation found in their respective testing measurements.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of forming a single layer wavelength converter, comprising:
    preselecting a distribution of at least first and second wavelength converting particles in a cured polymeric matrix material;
    forming a precursor of a wavelength converting composition on a substrate, said precursor of said wavelength converting composition comprising a matrix precursor and said first and second types of wavelength converting particles, said first and second types of wavelength converting particles having respective first and second settling rates within said matrix precursor;
    based at least in part on said first and second settling rates, curing said matrix precursor to form a single layer of said cured polymeric matrix material, the single layer of said cured polymeric matrix material comprising an actual distribution of said first and second wavelength converting particles that is substantially the same as said preselected distribution.

2. The method of claim 1, wherein said matrix precursor is selected from at least one of a thermally polymerizable matrix precursor and a photopolymerizable matrix precursor, and the method further comprises:
    when said matrix precursor is a thermally polymerizable matrix precursor, applying a curing temperature during curing of said matrix precursor, wherein said curing temperature is selected to provide sufficient time for said first and second types of wavelength converting particles to attain said actual distribution; and
    when said matrix precursor is a photopolymerizable matrix precursor, applying a curing light during curing of said matrix precursor, wherein an intensity of said curing light is selected to provide sufficient time for said first and second types wavelength converting particles to attain said actual distribution.

3. The method of claim 1, wherein said first type of wavelength converting particles comprise phosphor particles, and said second type of wavelength converting particles comprise quantum dot particles.

4. The method of claim 3, wherein said quantum dot particles comprise at least one of core quantum dot particles, core/shell quantum dot particles, and quantum dot beads.

5. The method of claim 4, wherein said quantum dot particles comprise quantum dot beads.

6. The method of claim 1, wherein curing said matrix precursor is performed at a predetermined cure rate, wherein said predetermined cure rate is selected based at least in part on said preselected distribution.

7. The method of claim 3, wherein in said actual and preselected distributions, said first and second types of wavelength converting particles are dispersed substantially homogenously within said cured matrix material.

8. The method of claim 3, wherein:
    the cured polymeric matrix material comprises a first region and a second region; and
    in said actual and preselected distributions, said first and second types of wavelength converting particles are dispersed such that said first region contains a higher concentration of said second type of wavelength converting particles than said second region, and said second region contains a higher concentration of said first type of wavelength converting particles than said first region.

9. The method of claim 8, wherein:
    said cured matrix material comprises a first surface, a second surface, and an intermediate region between said first and second regions;
    the first region is proximate the first surface;
    the second region is proximate the second surface; 6
    in said actual and preselected distributions, a concentration of said second type of wavelength converting particles within said intermediate region gradually decreases with increasing distance from said first surface, and a concentration of said first type of wavelength converting particles in said intermediate region gradually decreases with increasing distance from said second surface.

10. The method of claim 8, wherein:
said cured matrix material comprises an intermediate region between said first and second regions; and
the intermediate region contains substantially none of said second type of wavelength converting particles.

11. The method of claim 10, wherein said intermediate region contains substantially none of said first type of wavelength converting particles.

12. The method of claim 1, wherein said first and second settling rates are different.

13. The method of claim 1, further comprising:
determining said first settling rate based at least in part on a density and particle size of said first type of wavelength converting particles; and
determining said second settling rate based at least in part on a density and particle size of said second type of wavelength converting particles.

14. The method of claim 1, wherein said substrate comprises a light emitting diode package.

\* \* \* \* \*